(12) United States Patent  
Dabiri et al.

(10) Patent No.: US 7,747,923 B2  
(45) Date of Patent: Jun. 29, 2010

(54) LOW-POWER RECEIVER DECODING

(75) Inventors: Dariush Dabiri, San Jose, CA (US); Jose Tellado, Sunnyvale, CA (US)

(73) Assignee: Teranetics, Inc., San Jose, CA (US)

( * ) Notice: Subject to any disclaimer, the term of this patent is extended or adjusted under 35 U.S.C. 154(b) by 1620 days.

(21) Appl. No.: 10/926,699

(22) Filed: Aug. 26, 2004

(65) Prior Publication Data

US 2006/0047857 A1 Mar. 2, 2006

(51) Int. Cl.
*H03M 13/00* (2006.01)
(52) U.S. Cl. ........................ 714/758; 714/795
(58) Field of Classification Search .......... 714/758, 714/752, 742, 764, 774, 795, 798; 375/233, 375/354; 370/535
See application file for complete search history.

(56) References Cited

U.S. PATENT DOCUMENTS 6,253,345 B1 * 6/2001 Agazzi et al. ............... 714/752
6,615,385 B1 9/2003 Kim et al.
6,690,682 B1 * 2/2004 Giaretta et al. ............. 370/535
6,771,725 B2 * 8/2004 Agazzi et al. .............. 375/355
6,895,546 B2 5/2005 Ivry
6,995,693 B1 2/2006 Cross
7,369,633 B2 * 5/2008 Jiang et al. ................. 375/354
2004/0199747 A1 10/2004 Shelor

* cited by examiner

*Primary Examiner*—Fritz Alphonse
(74) *Attorney, Agent, or Firm*—Brian R. Short

(57) ABSTRACT

Embodiments of a method and apparatus for a transceiver decoding an Ethernet signal. The method includes receiving an Ethernet bit stream. The bit stream is at least one of low-complexity decoded by a low-complexity decoder of the transceiver or high-complexity decoded by a high-complexity decoder of the transceiver. If the bit stream fails a low-complexity decoding test, then the bit stream is high-complexity decoded. The low-complexity decoding and high complexity decoding are iteratively repeated until the bit stream passes the low-complexity decoding test.

28 Claims, 8 Drawing Sheets

LOW-POWER RECEIVER DECODING

FIELD OF THE INVENTION

The invention relates generally to network communications. More particularly, the invention relates to a method and apparatus for low-power receiver decoding.

BACKGROUND OF THE INVENTION

High-speed networks are continually evolving. The evolution includes a continuing advancement in the operational speed of the networks. The network implementation of choice that has emerged is Ethernet networks physically connected over unshielded twisted pair wiring. Ethernet in its 10/100BASE-T form is one of the most prevalent high speed LANs (local area network) for providing connectivity between personal computers, workstations and servers.

High-speed LAN technologies include 100BASE-T (Fast Ethernet) and 1000BASE-T (Gigabit Ethernet). Fast Ethernet technology has provided a smooth evolution from 10 Megabits per second (Mbps) performance of 10BASE-T to the 100 Mbps performance of 100BASE-T. Gigabit Ethernet provides 1 Gigabit per second (Gbps) bandwidth with essentially the simplicity of Ethernet. There is a desire to increase operating performance of Ethernet to even greater data rates.

An implementation of high speed Ethernet networks includes simultaneous, full bandwidth transmission, in both directions (termed full duplex), within a selected frequency band. When configured to transmit in full duplex mode, Ethernet line cards are generally required to have transmitter and receiver sections of an Ethernet transceiver connected to each other in a parallel configuration to allow both the transmitter and receiver sections to be connected to the same twisted wiring pair for each of four pairs.

FIG. 1 shows several Ethernet twisted pair LAN connections 112, 114, 116, 118 in parallel. The first connection 112 is between a first transmitter 115a (S1A) and first receiver 125a (R1A), and a second transmitter 115b (S1B) and a second receiver 125b (R1B). The second connection 114 is between a third transmitter 135a (S2A) and third receiver 145a (R2A), and a fourth transmitter 135b (S2B) and a fourth receiver 145b (R2B). The third connection 116 is between a fifth transmitter 155a (S3A) and fifth receiver 165a (R3A), and a sixth transmitter 155b (S3B) and a sixth receiver 165b (R3B). The fourth connection 118 is between a seventh transmitter 175a (S4A) and seventh receiver 185a (R4A), and an eighth transmitter 175b (S4B) and an eighth receiver 185b (R4B). Hybrid circuits 130a, 140b, 132a, 142b, 134a, 144b, 136a, 146b are included between the transmitters and receivers.

Information such as video, audio and data, is communicated over the networks as binary values. More specifically, the information is conveyed as zeros and ones. During transmission and processing of the information, errors can be unintentionally introduced. That is, a zero may be changed to a one, or vice versa. High speed networks, such as Gigabit Ethernet are more susceptible to these errors than slower speed networks because of the increased interference.

To provide a mechanism to check for errors and in some cases to correct errors, binary data can be coded to introduce carefully designed redundancy. Coding of a unit of data produces what is commonly referred to as a codeword. Because of its redundancy, a codeword often includes more bits that the input unit of data from which the codeword was produced. When signals arising from transmitted codewords are received or processed, the redundant information included in the codeword as observed in the signal can be used to identify and/or correct errors in transmitted data.

A class of codes referred to as low density parity check (LDPC), has emerged for use in data transmission. LDPC codes are coding schemes that use iterative decoders. It has been shown that LDPC codes can provide very good error correction for large codewords.

Longer codewords are often more reliable at error detection and correction due to the coding interaction over a larger number of bits. The use of longer codewords can be beneficial by increasing the ability to detect and correct errors. However, a difficulty in adopting LDPC code that include long codewords is the complexity of implementing the code. LDPC coding using long codewords are significantly more complex than traditionally used coding systems such as convolution codes and Reed-Solomon codes. The added complexity requires additional power.

It is desirable to have an apparatus and method for coding and decoding high speed transmission data that is complex, but yet dissipates low power.

SUMMARY OF THE INVENTION

An embodiment of the invention includes a method of decoding an Ethernet signal. The method includes receiving an Ethernet bit stream. The bit stream is at least one of low-complexity decoded or high-complexity decoded. If the bit stream fails a low-complexity decoding test, then the bit stream is high-complexity decoded. The low-complexity decoding and high complexity decoding are iteratively repeated until the bit stream passes the low-complexity decoding test.

An embodiment includes a low-complexity decoder generating a flag indicating whether the bit stream passed a low-complexity decoding test. The high-complexity decoder can be turned off when the flag indicates the bit stream passed the low-complexity decoder test. Turning of the high-complexity decoder can result in a reduction in power dissipation or a reduction in decoding latency.

Another embodiment includes an Ethernet receiver receiving a bit stream. The Ethernet receiver includes a low-performance decoder for low-complexity decoding the bit stream. A high performance decoder high-complexity decodes the bit stream if the bit stream fails the low-complexity decoding test of the low-complexity decoder. The low-complexity decoding of the bit stream followed by high-complexity decoding is iteratively repeated until the bit stream passes a low complexity decoder test.

Other aspects and advantages of the present invention will become apparent from the following detailed description, taken in conjunction with the accompanying drawings, illustrating by way of example the principles of the invention.

DETAILED DESCRIPTION

Figure 1:
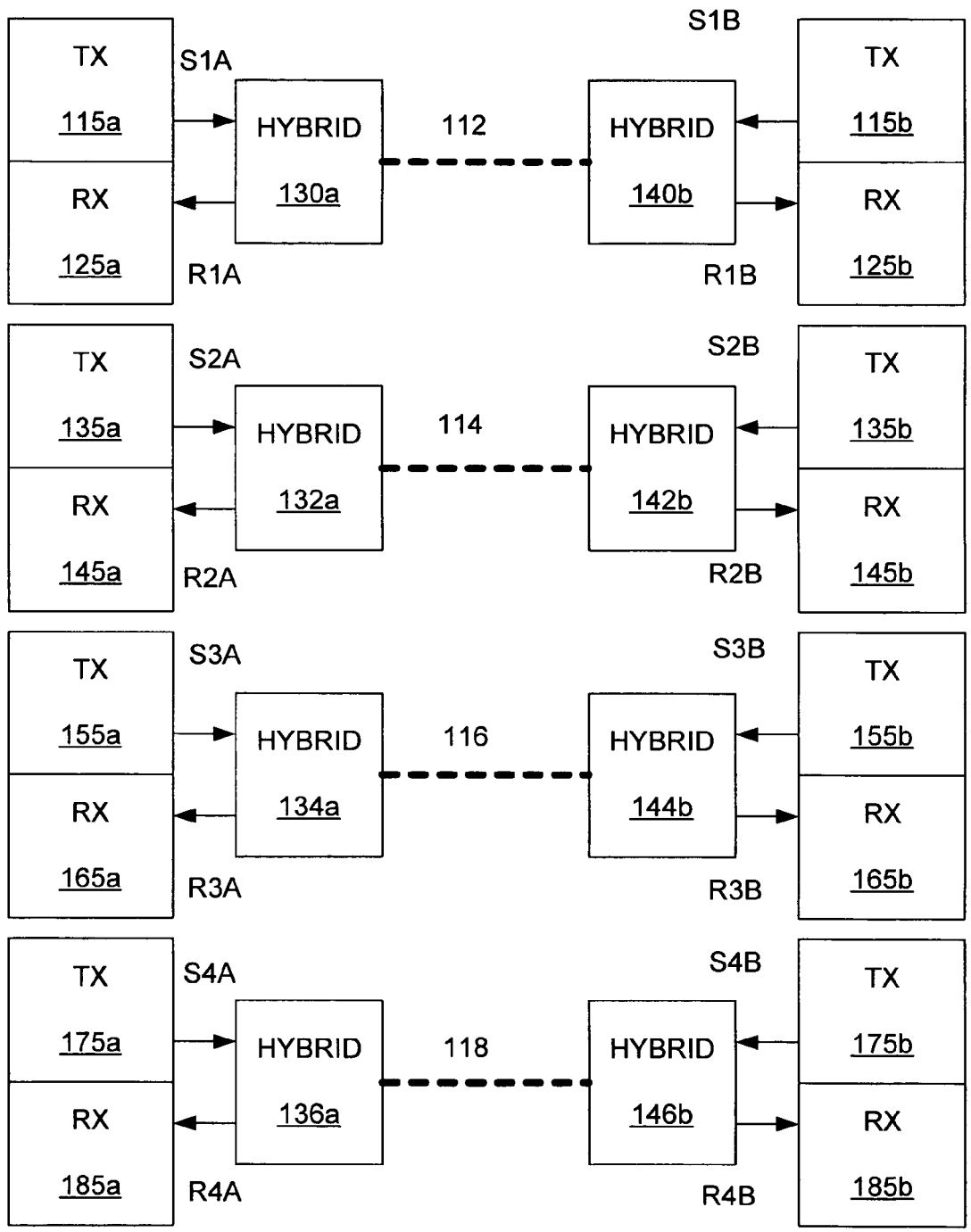
FIG. 1 shows a plurality of transceiver pairs located adjacently, and suffering from cross-talk coupling between signal streams of the transceiver pairs.

As shown in the drawings for purposes of illustration, the invention is embodied in an apparatus and method for high performance decoding of a bit stream. The decoding can be implemented for low-power dissipation, and/or low latency.

Decoding of a received bit stream can include multiplying blocks of the bit stream (code words) by a parity matrix. A resulting parity check vector can provide an estimation of the integrity of the received bit stream. An exemplary parity matrix can be given as:

$$\begin{bmatrix} 1 & 1 & 0 & 0 & 1 & 0 & 0 \\ 0 & 1 & 1 & 0 & 0 & 1 & 0 \\ 0 & 0 & 1 & 1 & 0 & 0 & 1 \end{bmatrix}$$

An exemplary codeword that includes 7 bits of the data stream can be given as:

$$\begin{bmatrix} x_1 \\ x_2 \\ x_3 \\ x_4 \\ x_5 \\ x_6 \\ x_7 \end{bmatrix}$$

A parity check vector is determined by multiplying the codeword with the parity check matrix. More specifically, the parity check vector can be give as:

$$\begin{bmatrix} 1 & 1 & 0 & 0 & 1 & 0 & 0 \\ 0 & 1 & 1 & 0 & 0 & 1 & 0 \\ 0 & 0 & 1 & 1 & 0 & 0 & 1 \end{bmatrix} \begin{bmatrix} x_1 \\ x_2 \\ x_3 \\ x_4 \\ x_5 \\ x_6 \\ x_7 \end{bmatrix} = \begin{bmatrix} 0 \\ 0 \\ 0 \end{bmatrix}$$

For this exemplary parity check vector, a first parity condition can be satisfied if x1+x2+x5=0, a second parity condition can be satisfied if x2+x3+x6=0, and a third parity condition can be satisfied if x3+x4+x7=0. The parity condition provides an indication of the integrity of the bits of the codeword of the received bit stream. The parity matrix and parity check vector provided here are for illustration purposes only.

Figure 2:
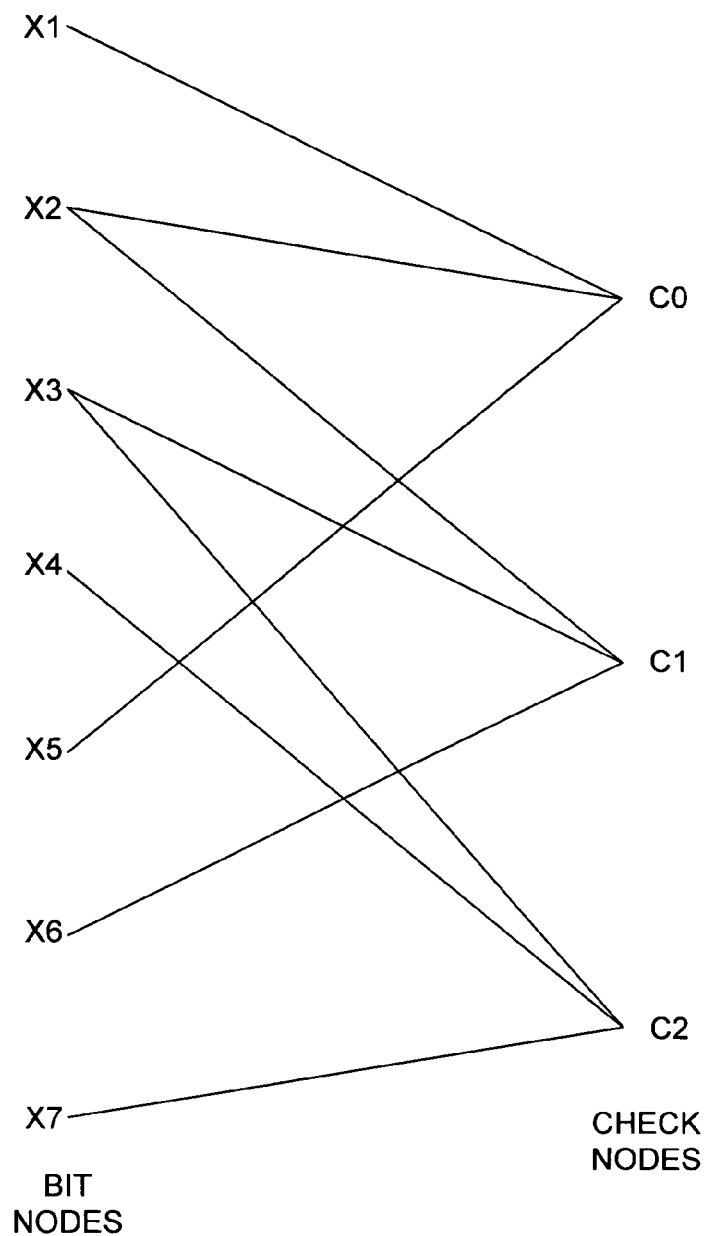
FIG. 2 shows a Tanner graph that depicts a relationship between check nodes and bit nodes.

FIG. 2 shows a Tanner graph that shows the relationship between bit nodes and check nodes of the above example. Variables C0, C1, C2 are check nodes, and represent the entries of the parity check vector. The bit nodes x1, x2, x3, x4, x5, x6, x7 are bit nodes, and represent the entries of the codeword. As shown, the check node C0 is dependent upon the bit nodes x1, x2, x5 the check node C1 is dependent upon the bit nodes x2, x3, x6 the check node C2 is dependent upon the bit nodes x3, x4, x7. the check nodes C0, C1, C2 correspond with the entries of the parity check vector. As will be described later, the values of the check nodes can be used to estimate the probabilities that the received bits x1, x2, x3, x4, x5, x6, x7 are correct.

Tanner graphs (like the one shown in FIG. 2) of LDPC codes generally include the property that no two distinct check nodes are connected to the same two distinct bit nodes. This is an important property of LDPC codes, and ensures that the codes don't have loops of a length of less than six. There are many possible implementations of iterative codes that satisfy this property. The implementations include a parity matrix that includes loops greater than six. Construction of the Tanner graphs is based upon finite geometry in which each bit code corresponds to a point, and each check node corresponds with a line. A loop is a path on the Tanner graph that starts at one node and ends at the same node without repeating any edge, wherein an edge is a connection between a bit node and a check node.

Figure 3:
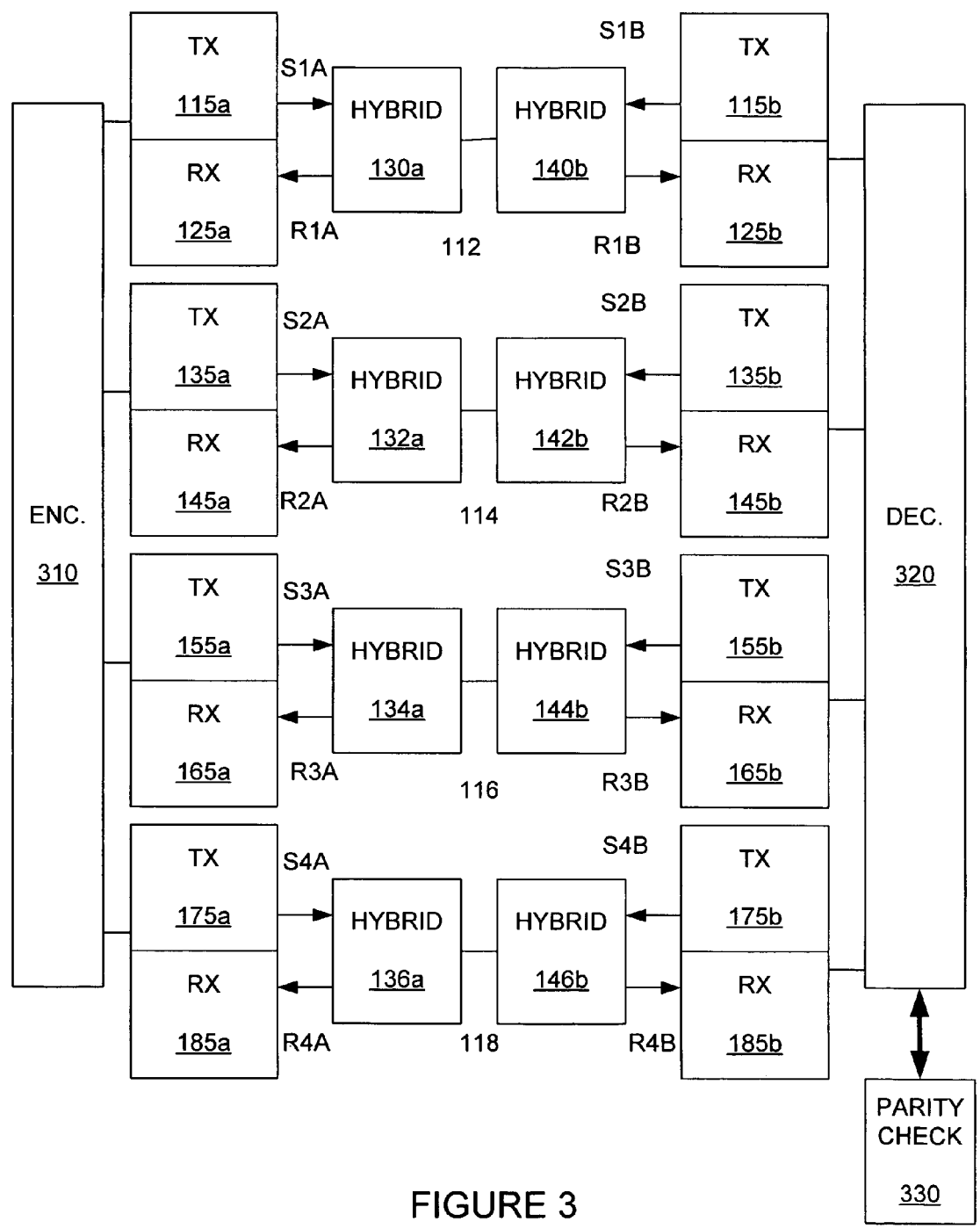
FIG. 3 shows a pair of transceivers that include an LDPC encoder and an LDPC decoder according to an embodiment of the invention.

FIG. 3 shows a pair of transceivers that include an LDPC encoder 310 and an LDPC decoder 320. A parity checker 330 determines whether a received bit stream passes a parity test. If the parity test is passed, the decoding stops. As will be described, the decoder 320 can include a low-complexity decoder and a high complexity decoder. If the received bit stream passes the low-complexity test, the high-complexity decoding can be minimized, which results in less power dissipation. The number of iterations in which the high-complexity test is performed can be less than traditional methods, thereby reducing the amount of power required to run circuitry of the high-complexity, high-power dissipation test.

Generally, LDPC decoding includes a sum product algorithm (SPA) for determining entries of a parity matrix. The complexity of the decoding is linearly dependent upon the column weight of the parity matrix, which is the number non-zero entries of each column. Improvements in performance of the decoding generally requires an increase in the column weight of the parity matrix, which typically increases the complexity, power dissipation, and/or the latency of the processing of the decoding.

Figure 4:
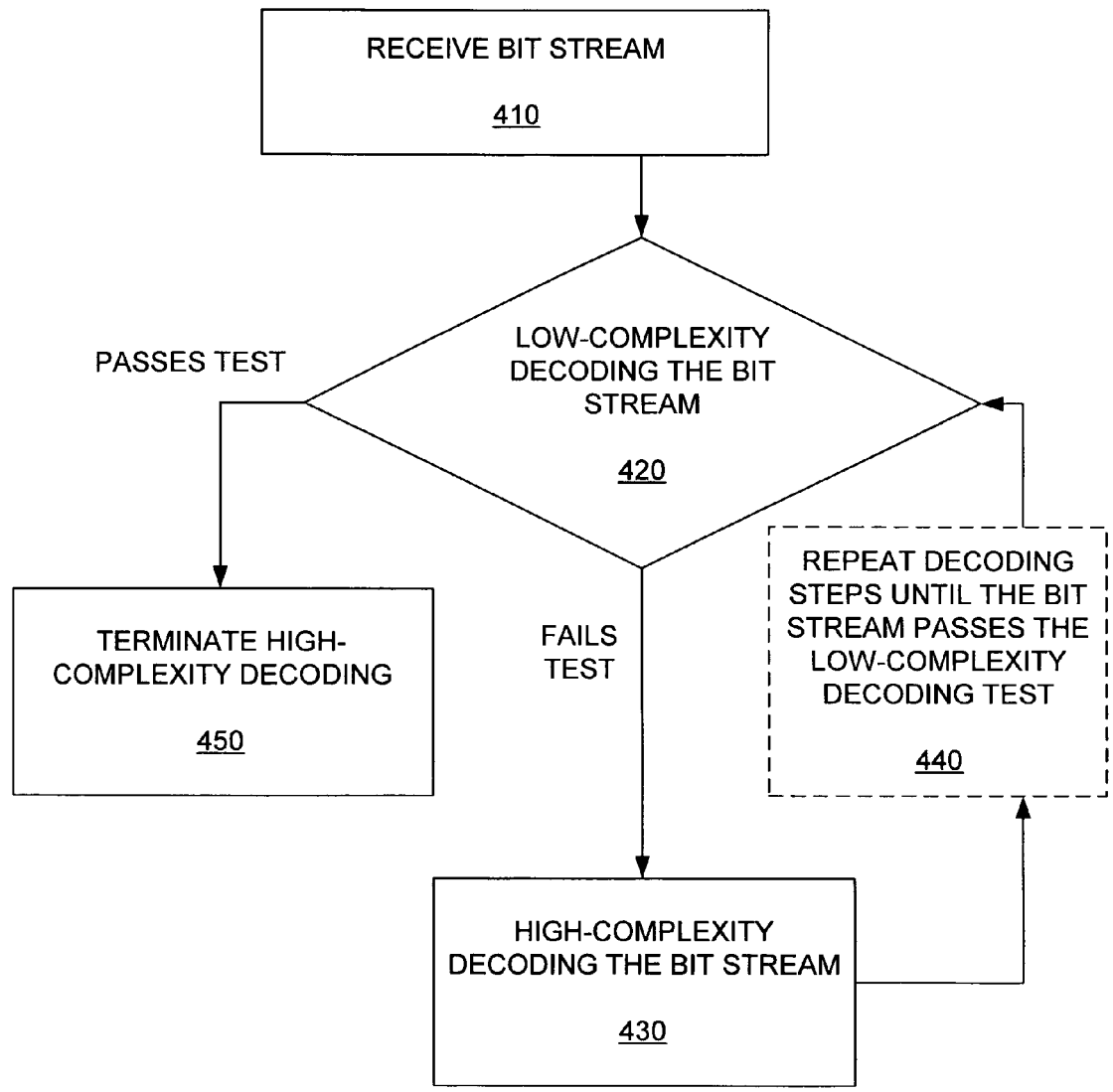
FIG. 4 shows a flow chart of steps that can be included within an embodiment of the invention.

FIG. 4 shows a flow chart of steps that can be included within an embodiment of a low power decoder. This embodiment includes a method of decoding an Ethernet signal. A first step 410 includes receiving an Ethernet bit stream. A second step 420 includes low-complexity decoding the bit stream. If the bit stream fails a low-complexity decoding test, then a third step 430 is performed that includes high-complexity decoding the bit stream. The second step 420, and/or the third step 430 are repeated until the bit stream passes the low-complexity decoding test (as indicated by a dashed box 440). The method described in FIG. 4 minimizes the number of times the high-complexity decoding must be executed. That is, the high-complexity decoding is only executed if the low-complexity test fails. Each iteration of the decoding (high and low) updates the codewords or bits being iteratively decoded.

Figure 5:
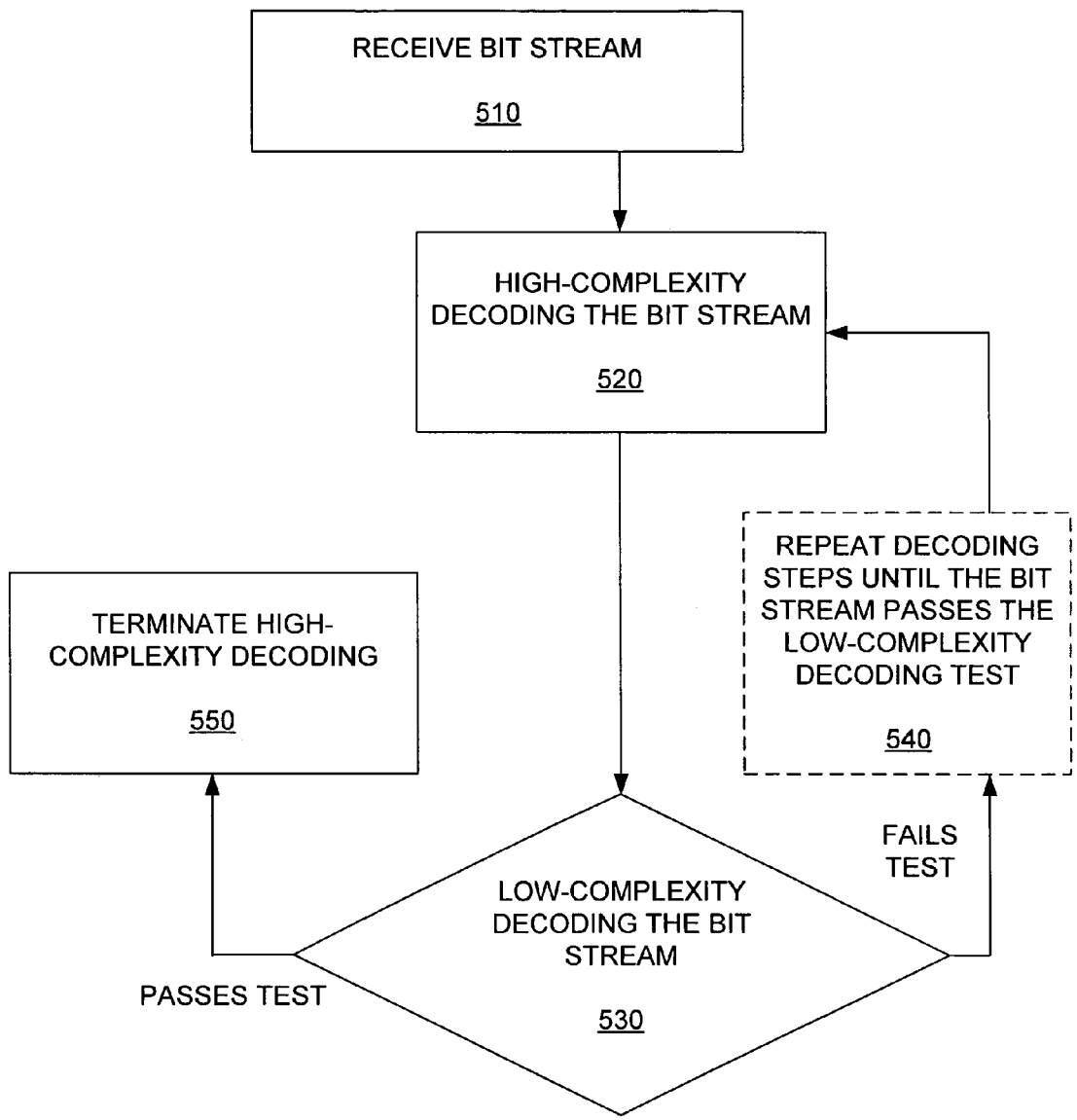
FIG. 5 shows a flow chart of steps that can be included within another embodiment of the invention.

FIG. 5 shows a flow chart of steps that can be included within another embodiment of a low power decoder. This embodiment also includes a method of decoding an Ethernet signal. A first step 510 includes receiving an Ethernet bit stream. A second step 520 includes high-complexity decoding the bit stream. A third step 530 includes low complexity decoding the bit stream. If the bit stream fails a low-complexity decoding test, then the second step 520 is again performed including high-complexity decoding the bit stream. The second step 520 and the third step 530 are repeated until the bit stream passes the low-complexity decoding test (as indicated by dashed block 540). The method described in FIG. 5 minimizes the number of times the high-complexity decoding must be executed.

Figure 6:
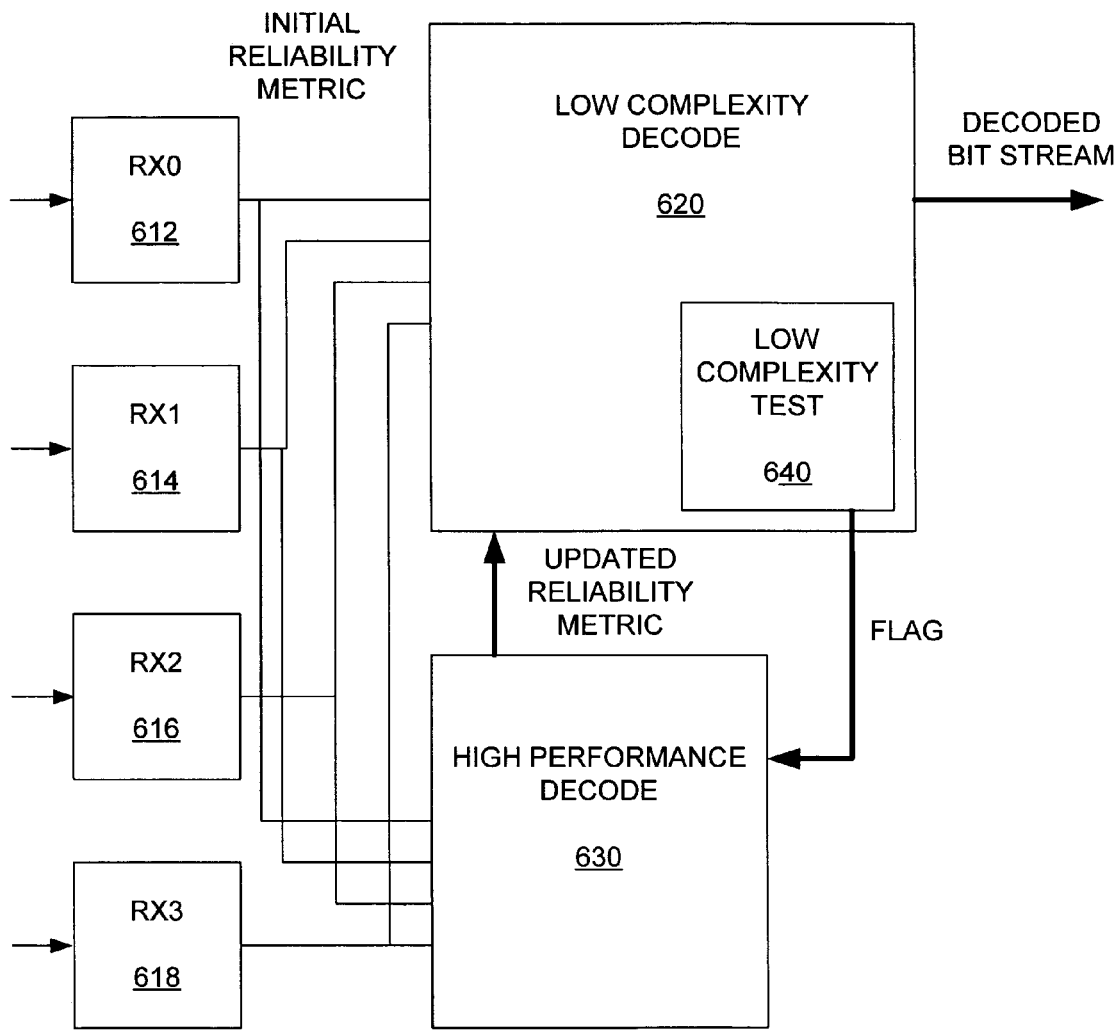
FIG. 6 shows a decoder within a receiver according to an embodiment of the invention.

FIG. 6 shows a decoder that can utilize the methods shown in FIG. 4 and FIG. 5. The decoder receives four Ethernet bit streams through four receivers 612, 614, 616, 618 within an Ethernet receiver. A reliability metric (the initial reliability metric) is extracted from the received bit stream and passed on to a low-complexity decoder 620 and a high-performance decoder 630. The low-complexity decoder 620 includes a low complexity test 640 that indicates whether the bit stream passes a predetermined low-complexity test.

The low-complexity decoder 620 generates a flag indicating whether the low-complexity test has been passed. The high-performance decoder 630 receives the flag, and the high-performance decoder 630 is halted or disabled to some extent when the flag indicates that the low-complexity test has been passed. The power dissipation and/or latency of the high-complexity decoder can be reduced by disabling circuitry of the high-complexity decoder 630.

Each iteration of high-performance decoding by the high-performance decoder 630 updates or modifies the reliability metric. The updated reliability metric is feedback to the low-complexity decoder 620 for low-complexity testing and/or low-complexity decoding. The low-complexity decoder 620 generates the decoded bit stream of the received bit stream. Each iteration of the low and high complexity updates the codewords with an updated estimate.

The low-complexity (low-performance) decoder and the high complexity (high-performance) decoder interact by passing unfinished and finished indicator flags. The high-complexity decoder decodes the most recent estimate of the codewords and provides the low-complexity decoder with updated reliability metrics. For each iteration, the low-complexity decoder attempts to decode the bit stream based upon the reliability metrics provided by the high-complexity decoder. The low-complexity decoder maintains the flag indicator that indicates to the high-complexity decoder that the low-complexity decoder failed to generate a codeword that passes the low-complexity test. Bases upon the failed indicator, the high-complexity decoder updates the reliability metrics by running at least one iteration of high-complexity decoding.

Adaptive High-Complexity Decoding

Figure 7:
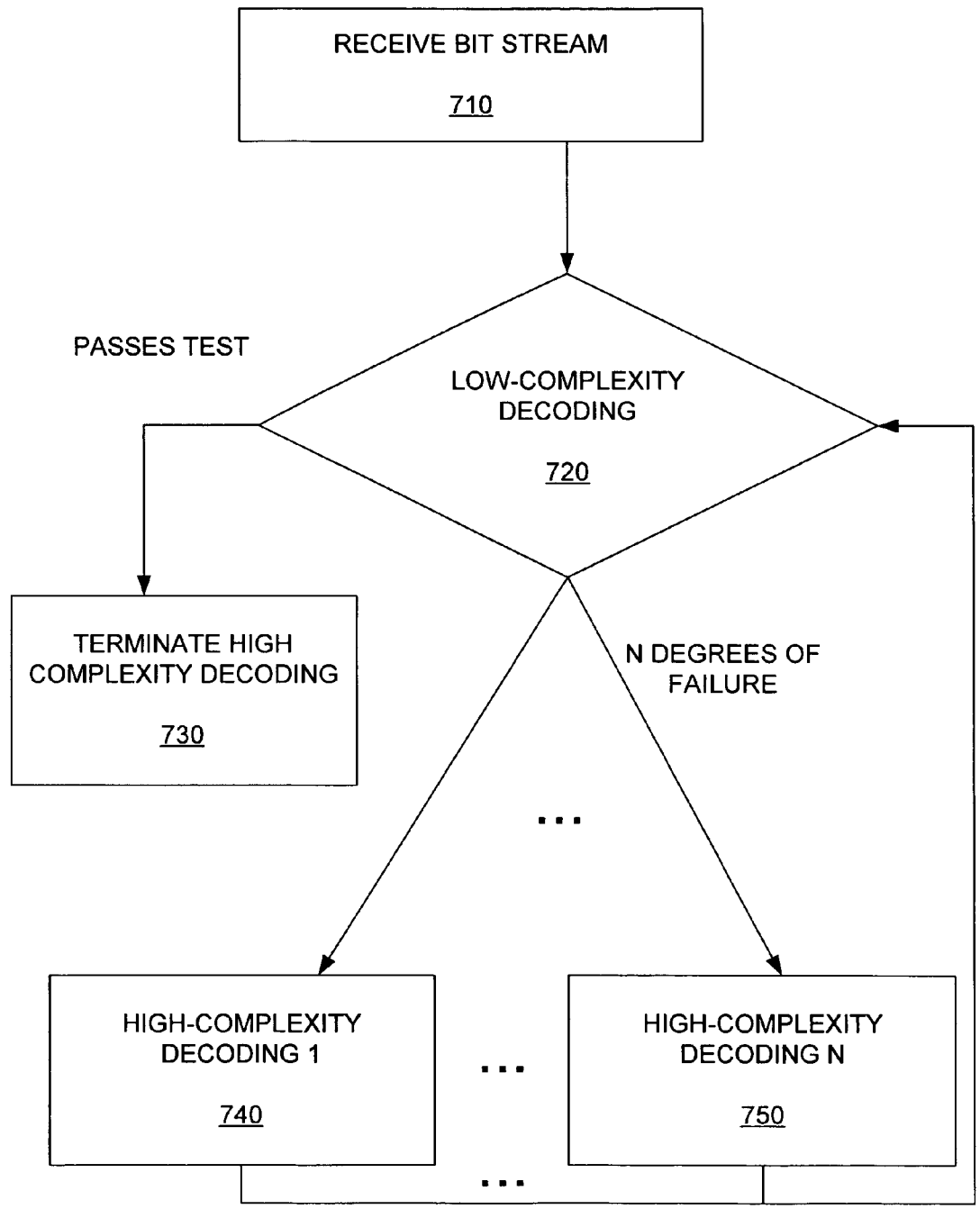
FIG. 7 shows a flow chart of steps that can be included within another embodiment of the invention, and further includes several levels of high-performance decoding.

FIG. 7 shows steps of another method of low-power decoding. The steps include a first step 710 of receiving a bit stream. A second step 720 includes low-complexity decoding of the bit stream. If the bit stream passes a low-complexity decoding test, the high-complexity decoding is not activated as indicated by step 730. If the low-complexity decoding test fails, a degree of failure is determined. For example, FIG. 7 shows that for N degrees of failure, N different high-complex decoding test can be performed. A failure parameter can provide an indication of the degree of failure.

A first degree of failure causes execution of a first degree of high-complexity decoding as shown in step 740. An Nth degree of failure causes execution of an Nth degree of high-complexity decoding as shown by step 750. Each of the degrees of high-complexity decoding includes different levels of complexity. After an iteration of one of the N high-complexity decoding, the low-complexity decoding is executed again. The process is repeated until the bit stream passes the low-complexity decoding test, and the high-complexity decoding is deactivated.

The various degrees of high-complexity decoding can be realized depending upon the high-complexity decoding algorithm used. The complexity can be varied by varying the number of unsatisfied check conditions, by varying the current iteration number, by varying the reliability metric, and by varying the sliced value.

FIG. 7 shows variable high-complexity decoding, however, the low-complexity decoding can be variably adjusted as well. If a decoding test fails by a predetermined amount, indicating that decoding is probably not useful, both high and/or low complexity decoding can be halted. The level of complexity of either the high and/or low complexity testing can be to some extent dependent upon signal quality of the received bit stream. For example, the level of complexity can be dependent upon SNR, BER or PER of the received bit stream.

Receiving the Ethernet Bit Stream

The bit stream is transmitted by modulating continuous analog waveforms. The receiver receives waveforms that are distorted by noise and interference. The waveforms are demodulated, and quantized by analog to digital converters within the receiver, generating a received bit stream. The receiver generates metrics that indicate the most likely value of each bit, and a degree of reliability associated with the most likely value. The log-likely hood metric of each bit generally includes a sign of a real number representing the most likely value, in which the magnitude of the real number indicates the reliability of the most likely value.

Typically, the bit steam is degraded by effects of the transmission channel, such as, interference, signal level attenuation and ISI. The coding and decoding helps to minimize these effects.

Low-Complexity Decoding and Low-Complexity Testing

Several different implementations of decoders can be used for the low complexity decoding. For example, the low complexity decoding can include forms of parity checking, threshold detecting, forms of a Gallagher algorithm test, forms of an Erasure decoding test, majority logic decoding and/or an SPA algorithm test.

An embodiment of parity checking can include multiplying code words of the bit stream with at least a sub-matrix of a predetermined parity matrix. An exemplary sub-matrix can be derived from a subset of parallel lines in an algebraic construction of an LDPC code. Another embodiment of the sub-matrix can include a size of the sub-matrix being selected based upon a signal quality parameter of the bit stream. Another embodiment of the sub-matrix can include a size of the sub-matrix is selected based upon early termination of previous codewords of the bit stream.

An embodiment of a threshold detection test can include receiving a block reliability metric corresponding to each code word within the bit stream. A reliability of each bit is calculated assuming parity check conditions associated with the bit are satisfied, based upon the associated parity check conditions and other bits associated with the bit. For each bit of the bit stream, the calculated reliability is added to a sum of previously calculated reliabilities. A low-complexity test associated with this method of decoding includes computing parity check conditions associated with sliced values of updated reliability metrics. The low-complexity test is passed if the parity check conditions are satisfied.

An embodiment of a Gallagher algorithm test can include slicing each bit of the data stream into two possible initial values. An expected value of each bit is calculated based upon all parity check conditions and other bits associated with the bit, assuming the parity check conditions are satisfied, and the other bits are correct. The initial value of each bit is changed if more than a predetermined number of expected values for the bit are different than the previously determined initial value. A low-complexity test associated with this method of decoding includes determining whether all expected values are the same as the initial values. A failure is indicated if they are the same. Another low-complexity test includes testing to determine if the decoding doesn't changed the value of any of the bits. Alternatively, the low-complexity test can include a parity check.

An embodiment of an Erasure decoding test includes slicing each bit of the data stream into three possible initial values. An expected value of each bit is calculated based upon all parity check conditions and other bits associated with the bit, assuming the parity check conditions are satisfied, and the other bits are correct. Each bit is recalculated based upon the initial values and the expected values. The re-calculated bits are re-sliced into three possible values. A low-complexity test associated with this decoding includes checking all or a subset of the parity conditions. The test can include all re-sliced values being non-zero, indicating that the decoding can be terminated. Another test further includes determination of whether the decoding changes the sliced values.

An embodiment of majority logic decoding includes slicing each bit of the data stream into two possible signal levels. For each bit, a number of parity check conditions are counted that are influenced and satisfied by each bit. If a number of satisfied parity check conditions is greater than a number of unsatisfied parity check conditions, then an original value of the bit is retained, otherwise, the value of the bit is flipped. A low-complexity test includes testing to determine if the decoding doesn't change the value of any of the bits. Alternatively, the low-complexity test can include a parity check An embodiment of a low-precision SPA algorithm test includes receiving a reliability metric associated with each word of the bit stream. A reliability parameter is calculated for each bit based upon all parity check conditions and other bits associated with the bit, assuming the parity conditions are satisfied, and the other bits are correct. The reliability metric is recalculated for each bit based upon the reliability parameter, initial reliability metric and parity check conditions associated with the bit. The low-complexity test can include a parity check Low Complexity Decoding Test The low complexity decoding test performs tests on the bit stream to determine whether a high-complexity bit stream test is required. If the quality of the bit stream is good enough, the high-complexity decoding does not have to be performed, and therefore, the high power complex decoding circuitry can be deactivated.

High-Complexity Decoding

The high-complexity decoding the bit stream can include LDPC decoding the bit stream. The LDPC decoding can include a sum product algorithm (SPA), a min-sum algorithm, or a soft input/soft output decoding algorithm.

An SPA decoder includes calculating a metric for each check node that indicates the most likely value of each bit associated with the check node. This involves calculating a marginal probability of each bit based upon reliability metrics of all other bits involved in the check condition. The reliability metric of each bit is updated by the product of the reliability metrics received from all check nodes associated with the bit. Other equivalent implementations of SPA decoding don't require multiplications of the reliability metrics. For these implementations, the check node calculations involve calculating a Gallagher function, that can be implemented as a look up table. The calculations of the bit nodes include summing the reliability metrics of all check nodes associated with the bit. Another version of the decoder includes a min-sum algorithm, in which the check node calculations include selecting a minimum from a set of metrics.

An embodiment of LDPC decoding includes receiving a reliability metric associated with each word of the bit stream. A reliability parameter for each bit is calculated based upon all parity check conditions and other bits associated with the bit, assuming the parity conditions are satisfied, and the other bits are correct. The reliability metric for each bit is recalculated based upon the reliability parameter, an initial reliability metric and parity check conditions associated with the bit.

As previously described, the high-complexity decoding can be turned off if a low-complexity test is passed. Turning off the high complexity decoding can reduce power dissipation and/or reduce latency. Turning off the high-complexity decoding can include gating of clocks, disabling loops, or setting an input to the decoder to a fixed value.

Single Iteration High-Complexity Decoding and Power Saving

Single iterations of the high-complex decoding is advantageous over systems that continually high-complexity decode because the high-complexity circuitry is not required to operate over extended periods of time, resulting in less dissipated power. Less iterations of the high-complexity test reduces the required amount of power.

A Network of Devices

Figure 8:
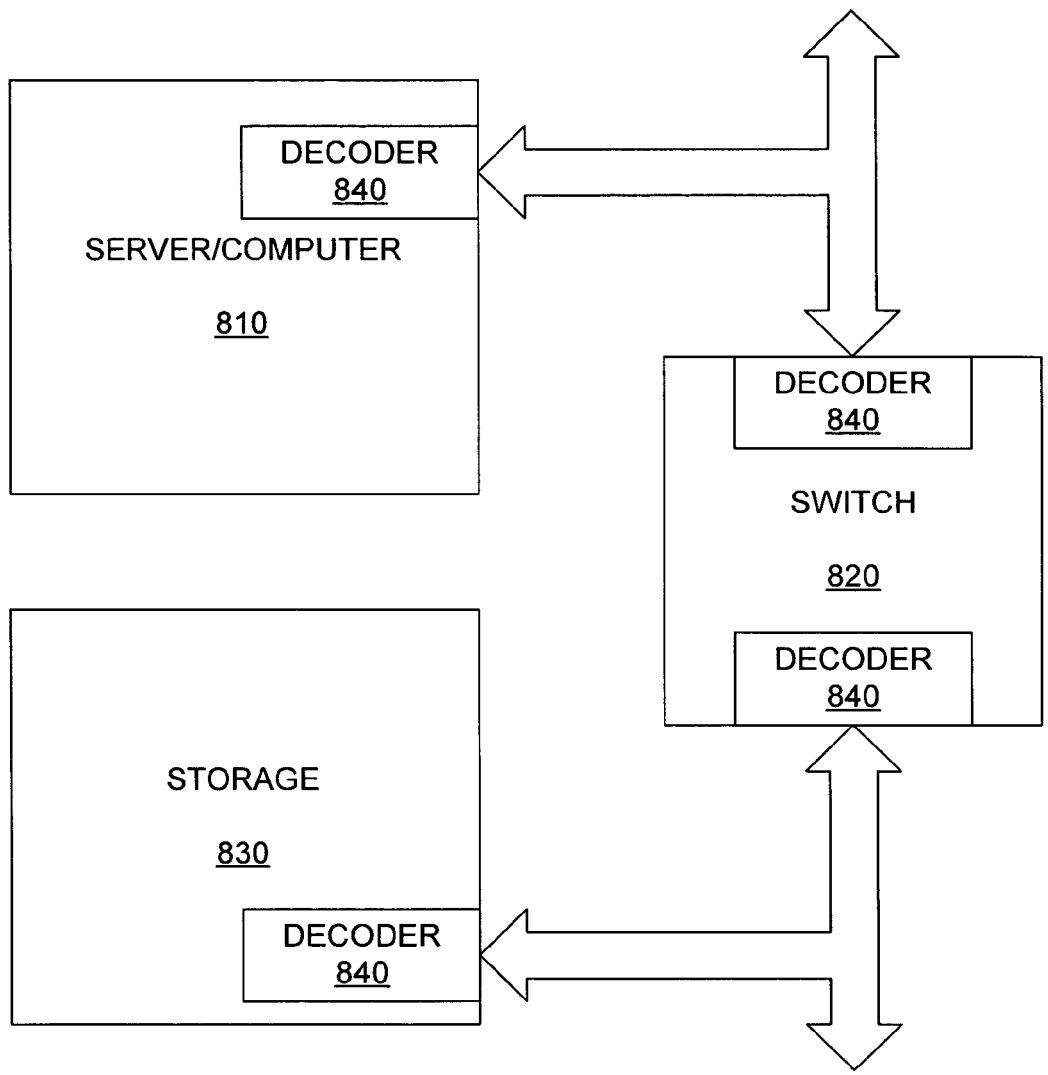
FIG. 8 shows devices connected to an Ethernet network that can include embodiments of the decoding.

FIG. 8 shows devices connected to an Ethernet network that can include embodiments of the decoding. The network includes a server/computer 810, a switch 820 and storage 830 that can all benefit from the use of a low-power decoder 840. The server/computer 810 can be connected to the switch 820 through an Ethernet twisted pair LAN connection. The switch 820 can additionally be connected to the storage 830 through an Ethernet twisted pair LAN connection. The low-power decoders 840 within the server/computer 810, the switch 820, and the storage 830 can provide minimization of ISI and FEXT interference of the Ethernet twisted pair LAN connections.

Although specific embodiments of the invention have been described and illustrated, the invention is not to be limited to the specific forms or arrangements of parts so described and illustrated. The invention is limited only by the appended claims.

What is claimed:

1. A method of a transceiver decoding an Ethernet signal, comprising:
   a. the transceiver receiving an Ethernet bit stream, the transceiver comprising a low-complexity decoder and a high-complexity decoder;
   b. the low-complexity decoder low-complexity decoding the bit stream or the high-complexity decoder high-complexity decoding the bit stream;
   c. if the bit stream fails a low-complexity decoding test, then
   d. the high-complexity decoder of the high-complexity decoding the bit stream;
   e. the transceiver repeating at least one of steps b and d until the bit stream passes the low-complexity decoding test.

2. The method of a transceiver decoding an Ethernet signal of claim 1, wherein at least one of the low-complexity decoding and the high-complexity decoding is halted after a predetermined number of iterations.

3. The method of a transceiver decoding an Ethernet signal of claim 1, wherein at least one of the low-complexity decoding and the high-complexity decoding is halted if the low-complexity test fails by a predetermined amount.

4. The method of a transceiver decoding an Ethernet signal of claim 1, further comprising a plurality of levels of high-complexity decoding, wherein a level of high-complexity decoding used to decode the bit stream is dependent upon at least one of a signal quality parameter of the bit stream and a number of iterations of decoding.

5. The method of a transceiver decoding an Ethernet signal of claim 1, further comprising a plurality of levels of low-complexity decoding, wherein a level of low-complexity decoding used to decode the bit stream is dependent upon at least one of a signal quality parameter of the bit stream and a number of iterations of decoding.

6. The method of a transceiver decoding an Ethernet signal of claim 1, further comprising turning off a high-complexity decoder if the bit stream passes the low-complexity decoding test.

7. The method of a transceiver decoding an Ethernet signal of claim 6, wherein turning off the high-complexity decoder reduces power dissipation of the transceiver.

8. The method of a transceiver decoding an Ethernet signal of claim 6, wherein turning off the high-complexity decoder comprises reducing latency of the decoding.

9. The method of a transceiver decoding an Ethernet signal of claim 6, wherein turning off the high-complexity decoder comprises at least one of gating clocks, disabling loops, or setting an input to the decoder to a fixed value.

10. The method of a transceiver decoding an Ethernet signal of claim 1, wherein the low-complexity decoding is performed by a low-complexity decoder that receives reliability outputs from a high-complexity decoder.

11. The method of a transceiver decoding an Ethernet signal of claim 10, wherein the reliability outputs comprise Log-Likelihood Ratios (LLRs) of the high-complexity decoder.

12. The method of a transceiver decoding an Ethernet signal of claim 10, wherein the low-complexity decoder generates the decoded Ethernet signal.

13. The method of a transceiver decoding an Ethernet signal of claim 10, further comprising the low-complexity decoder generating a flag indicating whether the bit stream passed a low-complexity decoding test.

14. The method of a transceiver decoding an Ethernet signal of claim 13, wherein the high-complexity decoder turns off when the flag indicates the bit stream passed the low-complexity decoder test.

15. The method of a transceiver decoding an Ethernet signal of claim 1, wherein the low-complexity decoding test comprises:
multiplying code words of the bit stream with at least a sub-matrix of a predetermined parity matrix.

16. The method of a transceiver decoding an Ethernet signal of claim 15, wherein the sub-matrix is derived from a subset of parallel lines in an algebraic construction of an LDPC code.

17. The method of a transceiver decoding an Ethernet signal of claim 15, wherein a size of the sub-matrix is selected based upon a signal quality parameter of the bit stream.

18. The method of a transceiver decoding an Ethernet signal of claim 15, wherein a size of the sub-matrix is selected based upon early termination of previous codewords of the bit stream.

19. The method of a transceiver decoding an Ethernet signal of claim 1, wherein the low-complexity decoding test comprises:
receiving a block reliability metric corresponding to each code word within the bit stream;
calculating a reliability of each bit assuming parity check conditions associated with the bit are satisfied, based upon the associated parity check conditions and other bits associated with the parity check conditions;
for each bit of the bit stream, adding the calculated reliability to a sum of previously calculated reliabilities.

20. The method of a transceiver decoding an Ethernet signal of claim 1, wherein the low-complexity decoding test comprises:
slicing each bit of the data stream into two possible initial values;
calculating an expected value of each bit based upon all parity check conditions and other bits associated with the bit, assuming the parity check conditions are satisfied, and the other bits are correct;
changing the initial value of each bit if more than a predetermined number of expected values for the bit are different than the previously determined initial value.

21. The method of a transceiver decoding an Ethernet signal of claim 1, wherein the low-complexity decoding test comprises:
slicing each bit of the data stream into three possible initial values;
calculating an expected value of each bit based upon all parity check conditions and other bits associated with the bit, assuming the parity check conditions are satisfied, and the other bits are correct;
re-calculating each bit based upon the initial values and the expected values;
re-slicing the re-calculated bits into three possible values.

22. The method of a transceiver decoding an Ethernet signal of claim 1, wherein the low-complexity decoding test comprises:
slicing each bit of the data stream into two possible signal levels;
for each bit, counting a number of parity check conditions that are influenced and satisfied by each bit;
if a number of satisfied parity check conditions is greater than a number of unsatisfied parity check conditions, then retaining an original value of the bit, otherwise, flipping the value of the bit.

23. The method of a transceiver decoding an Ethernet signal of claim 1, wherein the low-complexity decoding test comprises:
receiving a reliability information associated with each word of the bit stream;
calculating a reliability parameter for each bit based upon all parity check conditions and other bits associated with the bit, assuming the parity conditions are satisfied, and the other bits are correct;
re-calculating the reliability metric for each bit based upon the reliability parameter, an initial reliability metric and parity check conditions associated with the bit.

24. The method of a transceiver decoding an Ethernet signal of claim 1, wherein high-complexity decoding the bit stream comprises LDPC decoding the bit stream.

25. The method of a transceiver decoding an Ethernet signal of claim 1, wherein high-complexity decoding the bit comprises performing a soft input/soft output decoding algorithm.

26. The method of a transceiver decoding an Ethernet signal of claim 24, wherein LDPC decoding the bit stream comprises a sum product algorithm (SPA).

27. The method of a transceiver decoding an Ethernet signal of claim 24, wherein LDPC decoding the bit stream comprises a min-sum algorithm.

28. The method of a transceiver decoding an Ethernet signal of claim 24, wherein the LDPC decoding comprises:
receiving a reliability metric associated with each word of the bit stream;
calculating a reliability parameter for each bit based upon all parity check conditions and other bits associated with the bit, assuming the parity conditions are satisfied, and the other bits are correct;
re-calculating the reliability metric for each bit based upon the reliability parameter, an initial reliability metric and parity check conditions associated with the bit.

* * * * *